(12) United States Patent
Wang et al.

(10) Patent No.: US 8,030,842 B2
(45) Date of Patent: Oct. 4, 2011

(54) DISPLAY DEVICE AND METHOD OF MAKING DISPLAY DEVICE

(75) Inventors: Jianpu Wang, Gyeonggi-do (KR);
Joon-chul Goh, Seoul (KR); Dong-won Lee, Gyeonggi-do (KR); Jung-soo Rhee, Seoul (KR); Song-mi Hong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 229 days.

(21) Appl. No.: 12/424,456

(22) Filed: Apr. 15, 2009

(65) Prior Publication Data

US 2009/0256474 A1    Oct. 15, 2009

Related U.S. Application Data

(63) Continuation of application No. 11/502,933, filed on Aug. 11, 2006, now Pat. No. 7,528,543.

(30) Foreign Application Priority Data

Aug. 11, 2005    (KR) .............................. 2005-0073741

(51) Int. Cl.
*H01J 1/62* (2006.01)
*H01J 63/04* (2006.01)
*H01L 21/00* (2006.01)

(52) U.S. Cl. ........ 313/504; 313/505; 313/506; 313/498; 313/500; 438/29

(58) Field of Classification Search ........................ None
See application file for complete search history.

(56) References Cited

U.S. PATENT DOCUMENTS

| 7,064,482 | B2 * | 6/2006 | Park ............................. 313/504 |
| 7,528,543 | B2 * | 5/2009 | Wang et al. .................... 313/504 |
| 7,759,862 | B2 * | 7/2010 | Park et al. ..................... 313/506 |
| 2004/0100191 | A1 | 5/2004 | Park | |
| 2007/0120476 | A1 | 5/2007 | Park et al. | |

FOREIGN PATENT DOCUMENTS

| JP | 2004-11166 | 4/2004 |
| KR | 1020030013990 A | 2/2003 |
| KR | 1020040051072 A | 6/2004 |

* cited by examiner

*Primary Examiner* — Natalie Walford
(74) *Attorney, Agent, or Firm* — Innovation Counsel LLP

(57) ABSTRACT

A display device with increased lifespan is presented. The device includes a plurality of thin film transistors, a passivation layer formed on the thin film transistors, a plurality of pixel electrodes formed on the passivation layer and electrically connected to the thin film transistors, and a wall dividing the pixel electrodes. The wall has a main section and an auxiliary section that is lower than the main section. A caved-in section is disposed between the main section and the auxiliary section. An organic layer is formed on the pixel electrodes.

15 Claims, 13 Drawing Sheets

DISPLAY DEVICE AND METHOD OF MAKING DISPLAY DEVICE

CROSS-REFERENCE TO RELATED APPLICATION

This is a continuation application of U.S. patent application Ser. No. 11/502,933, filed Aug. 11, 2006, which application claims the benefit of Korean Patent Application No. 2005-0073741 filed on Aug. 11, 2005 in the Korean Intellectual Property Office, the disclosures of which are incorporated herein by reference.

BACKGROUND OF THE INVENTION

1. Field of the Invention

The present invention relates to a display device, and more particularly to a display device with a substantially flat organic layer.

2. Description of the Related Art

Among different types of flat panel displays, organic light emitting diode (OLED) has become popular due to its desirable characteristics such as low driving voltage, slim design, light weight, a wide viewing angle, and a quick response time. OLED is generally classified into a passive-matrix type and an active-matrix type depending on the driving method. In the active-matrix OLED, each thin film transistor thin film transistor is connected to a pixel area to control the organic light-emitting layer's emission by pixel areas. A pixel electrode is disposed in a pixel area and electrically separated from the adjacent pixel electrodes so that it can be driven independently. A wall higher than the pixel electrode is formed between the pixel areas to prevent the pixel electrodes from being short-circuited or accidentally coupling multiple pixel areas. On the pixel electrodes between the walls, a hole-injecting layer and the organic light-emitting layer are formed sequentially.

Where the hole-injecting layer and the organic light-emitting layer contain a polymer, they are usually formed by an ink-jet method. However, ink-jet method does not always result in the optimal layers. For example, the thickness of the hole-injecting layer and the organic light-emitting layer around the wall is greater than desired when the layers are formed with the ink-jet method. This excessive thickness around the wall compromises the uniformity of brightness and reduces the lifespan of the display.

SUMMARY OF THE INVENTION

Accordingly, it is an aspect of the present invention to provide a display device in which an organic layer is substantially flat. Another aspect of the present invention is to provide a method of making a display device in which an organic layer is substantially flat.

The foregoing and/or other aspects of the present invention are also achieved by providing a display device. The display device includes a plurality of thin film transistors, a passivation layer formed on the thin film transistors, a plurality of pixel electrodes formed on the passivation layer and electrically connected to the thin film transistors, and a wall dividing the pixel electrodes. The wall has a main wall and an auxiliary wall that is lower than the main wall. A caved-in part is disposed between the main wall and the auxiliary wall. An organic layer is formed on the pixel electrodes.

The foregoing and/or other aspects of the present invention are also achieved by providing a method of making a display device. The method entails providing a plurality of thin film transistors and a passivation layer on an insulating substrate, providing a plurality of pixel electrodes electrically connected to the thin film transistors on the passivation layer, forming a wall dividing the pixel electrodes, and forming an organic layer on the pixel electrodes. The wall has a main wall and an auxiliary wall that is lower than the main wall. A caved-in part is disposed between the main wall and the auxiliary wall.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE EMBODIMENT(S)

Figure 1A:
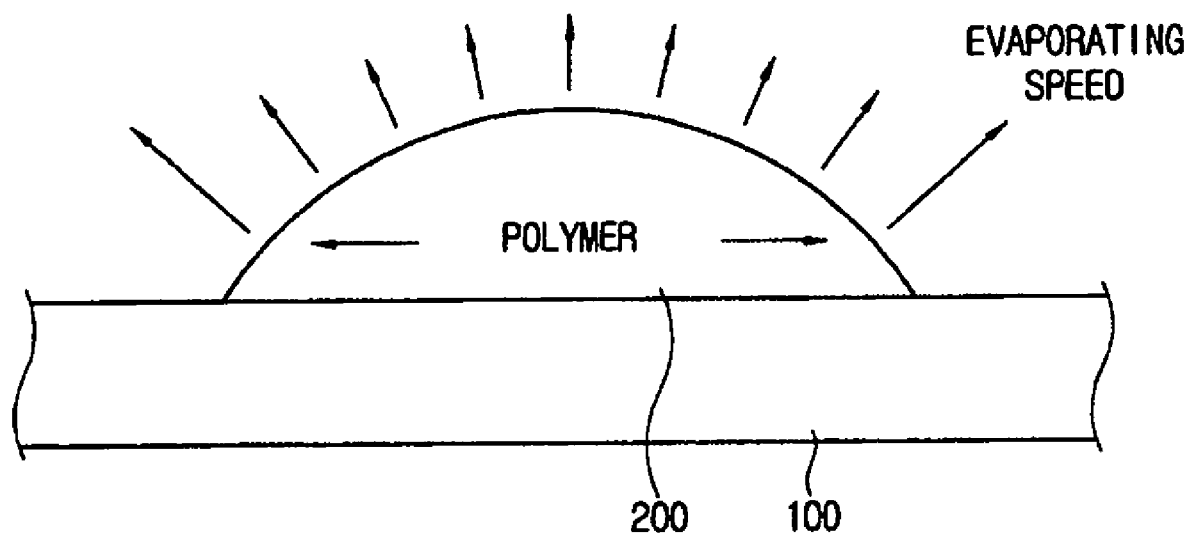
FIGS. 1A and 1B illustrate a problem with the conventional method when a polymer solution is dried.

Reference will now be made in detail to exemplary embodiments of the present invention, examples of which are illustrated in the accompanying drawings. In the drawings, like reference numerals refer to like elements throughout. The embodiments are described below to explain the present invention by referring to the figures.

First, a problem when a polymer solution is dried will be described with reference to FIGS. 1A and 1B.

When making a display device, a polymer is dissolved in a solvent to make a polymer solution, and then an organic layer is formed by depositing the polymer solution with an ink-jet method. The organic layer, for example, is used as a hole-injecting layer or a light-emitting layer of an OLED and may have tens to hundreds of nm of thickness.

Figure 1B:
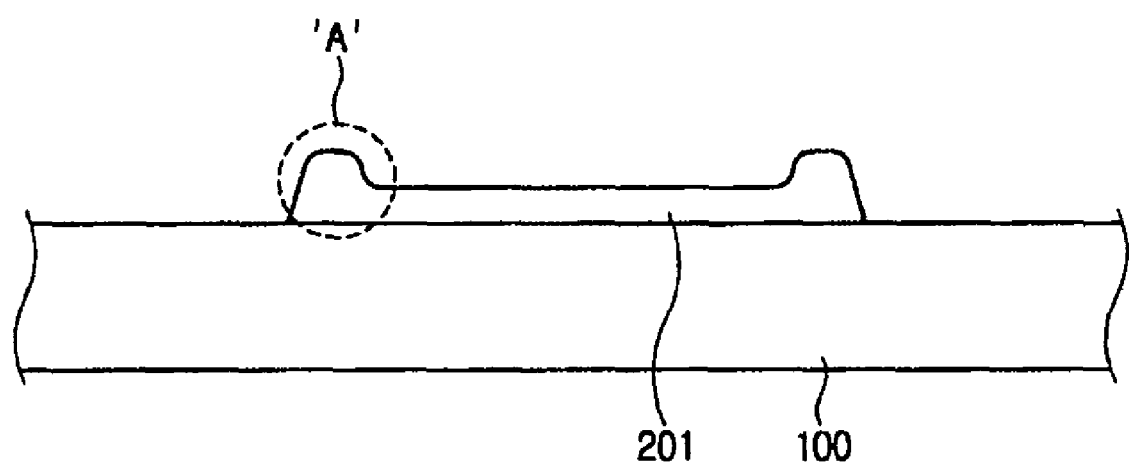

FIG. 1A shows that a polymer solution 200 is dropped on an insulating substrate 100, and FIG. 1B shows that the solvent is removed from the polymer solution 200 to form the organic layer 201.

The polymer solution 200 has a dome shape—i.e., it is thicker in the middle than at the edge due to its surface tension. Vapor density of the solvent is higher in the middle than at the edge. Since the drying speed of the solvent is inversely proportional to the vapor density around the polymer solution 200, the solvent dries faster at the edge than in the middle. The polymer of the polymer solution 200 transfers to the edge where the solvent dries fast, and thus the organic layer 201 formed accordingly is higher at the edge "A" than in the middle, as shown in FIG. 1B.

If the organic layer 201 has the shape shown in FIG. 1B, its lifespan is decreased as well as its aperture ratio, and the brightness difference between the edge and the middle of the organic layer 201 increases.

Various techniques have been tried to avoid the problem of uneven thickness in the organic layer 201. For example, the polymer solution 200 was prepared using a low-solubility solvent and dried at a high temperature. When dried at high temperature, the polymer solution dries quickly to obtain a comparatively flat organic layer. However, the lifespan and efficiency of the organic layer 201 are still negatively affected.

When the polymer solution is prepared using a solvent having low solubility, the polymer becomes a gel that interferes with migration of the polymer molecules to the edge. Thus, a comparatively flat organic layer is obtained. However, the polymer solution easily turns into a gel during storage and transport.

To solve this problem, the present invention changes the structure of the wall where the polymer solution is disposed.

Figure 2:
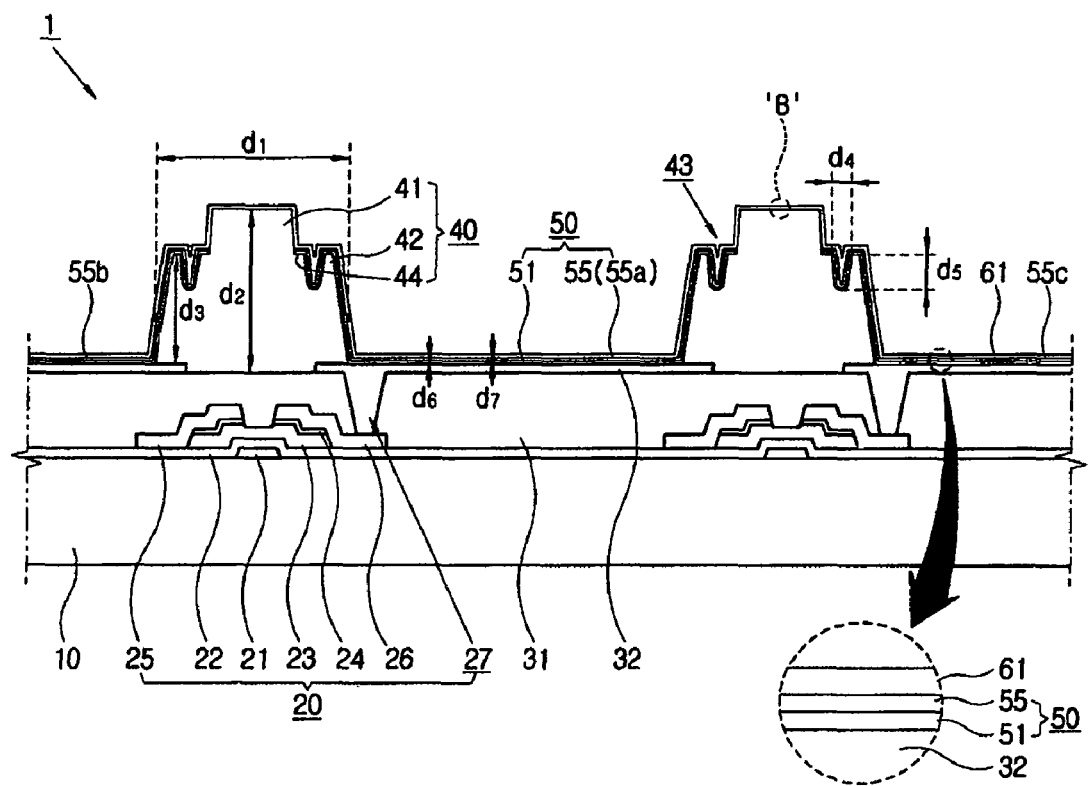
FIG. 2 is a sectional view of a display device according to a first embodiment of the present invention.

FIG. 2 is a sectional view of a display device according to a first embodiment of the present invention.

A display device 1 according to the present invention includes a thin film transistor (TFT) formed on an insulating substrate 10, a pixel electrode 32 electrically connected to the thin film transistor 20, a wall 40 between the pixel electrodes 32, an organic layer 50 formed on the pixel electrode 32 and a common electrode 61 formed on the organic layer 50.

In the first embodiment, the thin film transistor is made of amorphous silicon. However, this is just an exemplary embodiment and not a limitation of the invention. Other types of thin film transistors, such as a thin film transistor made of polysilicon, would also be within the scope of the invention.

The display device according to the first embodiment will now be described.

A gate electrode 21 is formed on the insulating substrate 10 which contains an insulating material such as glass, quartz, ceramic, or plastics, among others.

A gate insulating layer 22 containing silicon nitride (SiNx) or the like is formed on the insulating substrate 10 and the gate electrode 21. A semiconductor layer 23 of amorphous silicon and an ohmic contact layer 24 of n+ hydrogenated amorphous silicon highly doped with n-type dopant are formed sequentially on the gate insulating layer 22 where the gate electrode is disposed. Here, the ohmic contact layer 24 is divided into two parts with respect to the gate electrode 21.

A source electrode 25 and a drain electrode 26 are formed on the ohmic contact layer 24 and the gate insulating layer 22. The source electrode 25 and the drain electrode 26 are separated from each other by a gap above the gate electrode 21.

A passivation layer 31 is formed on the source electrode 25, the drain electrode 26, and parts of the semiconductor layer 23 that are not covered with the source electrode 25 or the drain electrode 26. The passivation layer 31 contains silicon nitride (SiNx) and/or an organic layer. The passivation layer 31 has a contact hole 27 that extends through it to expose the drain electrode 26.

The pixel electrode 32 is formed on the passivation layer 31. The pixel electrode 32 acts as an anode and provides holes to the organic layer 50. The pixel electrode 32 contains a transparent conductive material such as indium tin oxide (ITO) or indium zinc oxide (IZO). The pixel electrode 32 is patterned in an approximately rectangular shape in plan view and is about 50 to about 200 nm thick.

The wall 40 is formed between the pixel electrodes 32. The wall 40 extends between the pixel electrodes 32 to define a pixel area and is formed on the thin film transistor 20 and the contact hole 27. The wall 40 prevents the source electrode 25 and the drain electrode 26 from being short-circuited with the common electrode 61. The wall 40 contains a photoresist having a thermal resistance and a solvent-resisting property, such as acrylic resin, polyimide resin or the like. The wall 40 may also contain an inorganic material such as $SiO_2$ and $TiO_2$, thus having a double-layer structure of an organic layer and an inorganic layer.

The wall 40 includes a main wall 41 flanked by auxiliary walls 42 disposed on two sides of the main wall 41. As shown, the auxiliary walls 42 are lower than the main wall 41. Caved-in parts 43 are formed between the main wall 41 and the auxiliary walls 42. Flat parts 44 are disposed between the caved-in parts 43 and the main wall 41 and extend substantially parallel to the pixel electrode 32. The flat parts 44 are as high as the auxiliary walls 42. During the formation of the organic layer 50, the main wall 41 prevents adjacent organic layers 50 from mixing with each other. The caved-in parts 43 increase vapor density around the wall 40 to form the organic layer 50 with a uniform thickness.

The width d1 of the wall 40 is in the range of about 40 μm to about 60 μM. The height d2 of the main wall 41 is in the range of about 0.5 μm to about 5 μm, and the height d3 of the auxiliary walls 42 is in the range of about 0.25 μm to about 4.5 μm, or about 50% to about 90% of the height d2 of the main wall 41. If the height d3 of the auxiliary walls 42 is 50% of the height d2 of the main wall 41 or less, it is hard to achieve the depth d5 for the caved-in parts 43. If the height d3 of the auxiliary walls 42 is 90% of the height d2 of the main wall 41 or more, the inter-pixel partitioning effect of the wall 40 becomes compromised such that the adjacent organic layers 50 may mix with each other during the formation of the organic layer 50.

The width d4 of the caved-in parts 43 is in the range of about 0.5 μm to about 10 μm and the depth d5 thereof is in the range of about 50% to about 300% of the width d4. If the depth d5 of the caved-in parts 43 is about 50% of the width d4 or less, the effect of increasing the vapor density around the wall 40 becomes weakened, and thus the organic layer 50 may be formed thickly around the wall 40. If the depth d5 of the caved-in parts 43 is 300% of the width d4 or more, the caved-in parts 43 have a steep slope, and thus the common electrode 61 may be discontinuous within the caved-in parts 43.

The organic layer 50 is formed on the auxiliary walls 42, the caved-in parts 43 and a portion of the pixel electrode 32 that is not covered with the wall 40. The adjacent organic layers 50 are separated by the main wall 41, and accordingly the organic layer 50 is not formed on a surface "B" of the main wall 41.

The organic layer 50 includes a hole-injecting layer 51 and a light-emitting layer 55.

The thickness d6 of the hole-injecting layer 51 is approximately in the range of about 50 nm to about 400 nm, and is preferably about 200 nm. The hole-injecting layer 51 formed on the pixel electrode 32 is substantially uniformly thick regardless of the distance from the wall 40. The thickness of the hole-injecting layer 51 formed on the auxiliary walls 42 and the caved-in parts 43 may be different from the thickness on the pixel electrode 32. Usually, the hole-injecting layer 51 formed on the caved-in parts 43 is thinner than the hole-injecting layer 51 formed on the pixel electrode 32.

The hole-injecting layer 51, for example, may be made of poly thiophene derivatives such as poly-3,4-ethylenedioxythiophene (PEDOT) and a compound such as poly styrene-sulfonate (PSS).

The light-emitting layer 55 includes a red light-emitting layer 55a, a green light-emitting layer 55b and a blue light-emitting layer 55c. The thickness d7 of the light-emitting layer 55 is approximately in the range of about 50 nm to about 400 nm, and is preferably about 200 nm. The light-emitting layer 55 formed on the pixel electrode 32 is substantially uniformly thick regardless of the distance from the wall 40.

the thickness of the light-emitting layer 55 formed on the auxiliary walls 42 and the caved-in parts 43 may be different from one on the pixel electrode 32. As with the hole-injecting layer 51 described above, the light-emitting layer 55 formed on the caved-in parts 43 is usually thinner than the light-emitting layer 55 on the pixel electrode 32.

The light-emitting layer 55 may be made of polyfluorene derivatives, poly(p-phenylene vinylene) derivatives, polyphenylene derivatives, poly(N-vinylcarbazole) derivatives and poly thiophene derivatives or compounds thereof doped with a perillene group pigment, rhodamine, rubrene, perillene, 9,10-diphenylanthracene, tetraphenylbutadiene, nile red, cumarine 6, quinacridone, etc.

Holes transmitted from the pixel electrode 32 and electrons transmitted from the common electrode 61 are combined in the light-emitting layer 55 to form excitons. As is well-known, the excitons generate energy in the form of light when transitioning to a lower energy level state.

The common electrode 61 is disposed on the wall 40 and the light-emitting layer 55. The common electrode 61 functions as a cathode and provides electrons to the light-emitting layer 55. The common electrode 61 may be made of a calcium layer and an aluminum layer that are sequentially deposited. In this case, a layer having a low work function is preferably disposed closer to the light-emitting layer 55 than the other layer. The common electrode 61 directly contacts the light-emitting layer 55 to inject the electrons. The common electrode 61 directly contacts the surface "B" of the main wall 41.

Lithium fluoride may increase the light-emitting efficiency depending on the material of the light-emitting layer 55. Thus, to take advantage of this possibility, a lithium fluoride layer may be formed between the light-emitting layer 55 and the common electrode 61. Where the common electrode 61 is made of a non-transparent material such as aluminum and silver, the light emitted from the light-emitting layer 55 exits the structure through the insulating substrate 11. This is called a bottom-emission method.

Although not shown, the display device 1 may also include an electron transfer layer and an electron injection layer between the light-emitting layer 55 and the common electrode 61. Moreover, the display device 1 may further comprise a passivation layer to protect the common electrode 61 and a bag to prevent moisture and air from penetrating into the organic layer 50. The bag may be a sealing resin and a sealing can.

As described above, the display device 1 according to the first embodiment comprises the hole-injecting layer 51 and the light-emitting layer 55 of uniform thickness. Accordingly, brightness becomes uniform across the pixel area and the aperture ratio and lifespan increase.

Hereinafter, a method of making the display device according to the first embodiment of the present invention will be described with reference to FIGS. 3A through 3H.

Figure 3A:
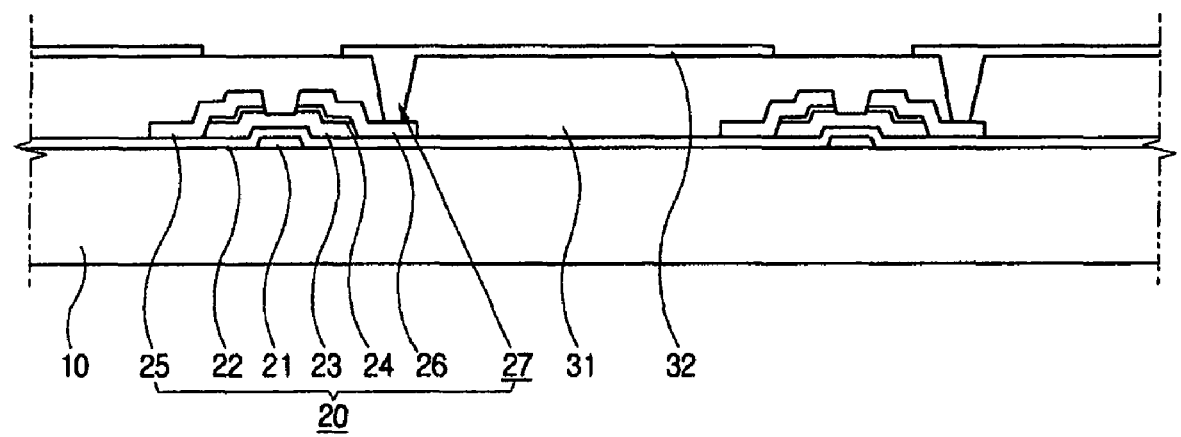
FIGS. 3A through 3H are sectional views to illustrate a method of making a display device according to the first embodiment of the present invention.

Referring to FIG. 3A, the thin film transistor 20 is formed on the insulating substrate 10. The thin film transistor 20 has a channel region made of amorphous silicon and is manufactured by any suitable conventional method. Then, the passivation layer 31 is formed on the thin film transistor 20. The passivation layer 31 may include a layer of silicon nitride that is formed by a chemical vapor deposition. The passivation layer 31 is patterned by photolithography to form a contact hole 27 that exposes the drain electrode 26. Thereafter, ITO is deposited by a sputtering method and patterned to form the pixel electrode 32. The pixel electrode 32 is connected with the drain electrode 26 through the contact hole 27.

Figure 3B:
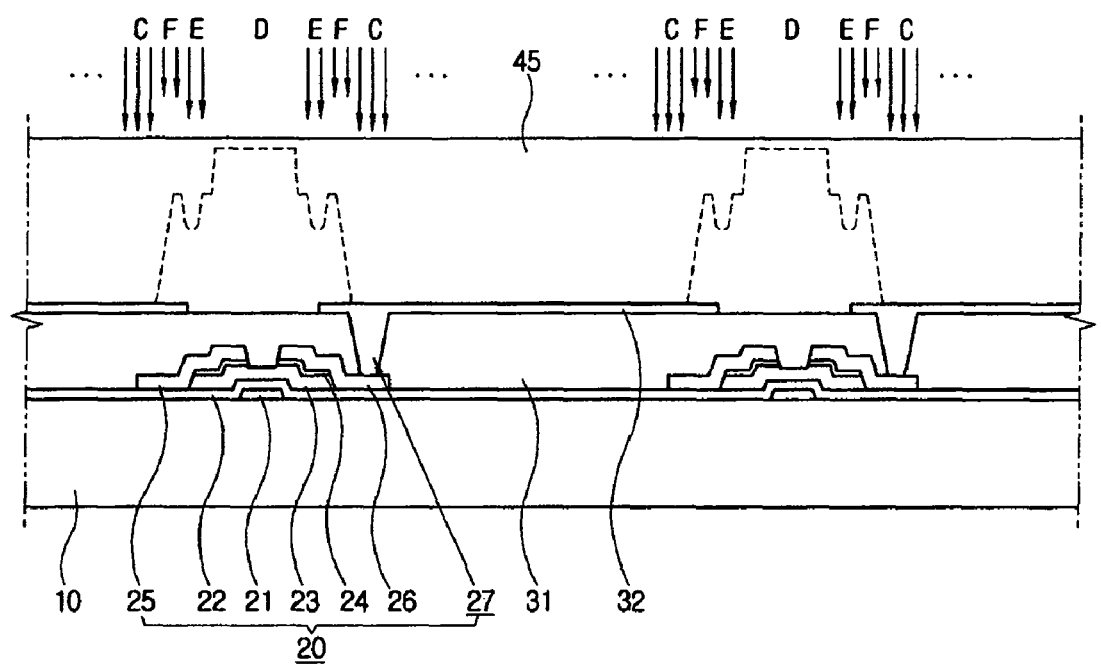

Referring to FIG. 3B, a wall material layer 45 is formed on the pixel electrode 32 and the passivation layer 31 and exposed. The wall material layer 45 may contain a photoresist and may be formed by a slit coating method or a spin coating method. The wall material layer 45 is exposed with a slit mask (not shown) to form the wall 40. An area C on the pixel electrode 32 where the wall 40 is not formed is exposed to high intensity light and an area D where the main wall 41 is formed is not exposed to light at all. An area E where the caved-in parts 32 are formed is exposed to light having an intensity level between the intensity level used for the D-area and the intensity level used for the C-area. An area F where the auxiliary walls 42 are formed is exposed to light having an intensity level between the intensity level used for the E-area and the intensity level used for the D-area. Although not shown in the drawings, an area where the flat parts 44 are formed is exposed with light having an intensity level between the intensity level used for the D-area and the intensity level used for the E-area.

Figure 3C:
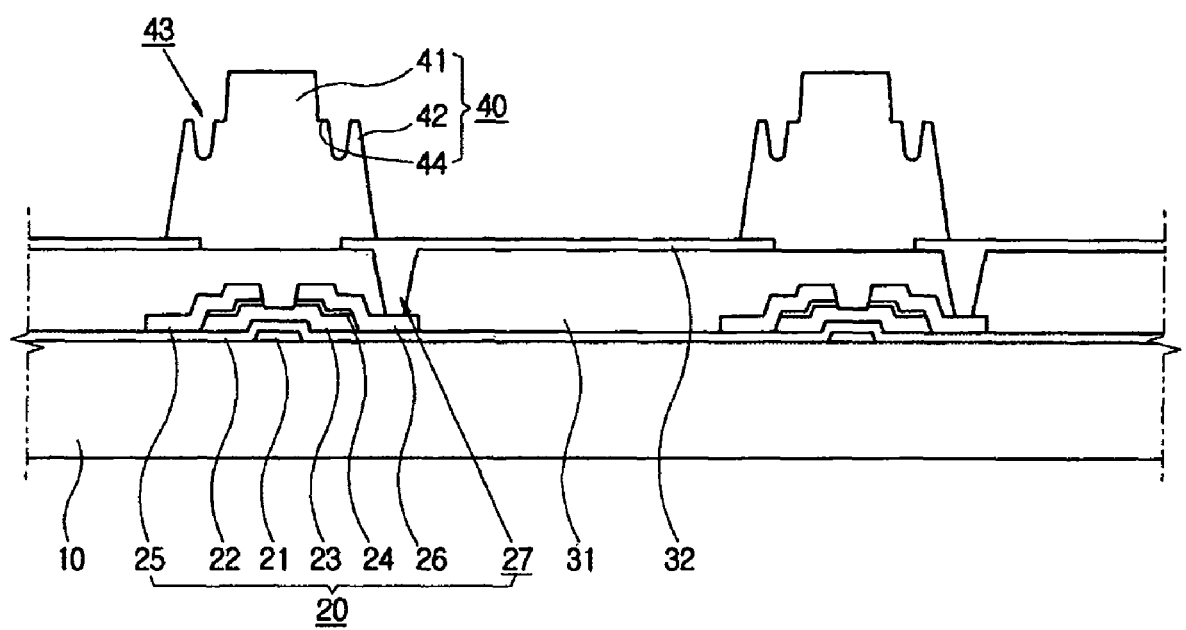

FIG. 3C shows the wall 40 that is formed after exposing the wall material layer 45. The height of the wall 40 is slightly lower than that of the wall material layer 45 since the wall material layer 45 is developed to form the wall 40.

Figure 3D:
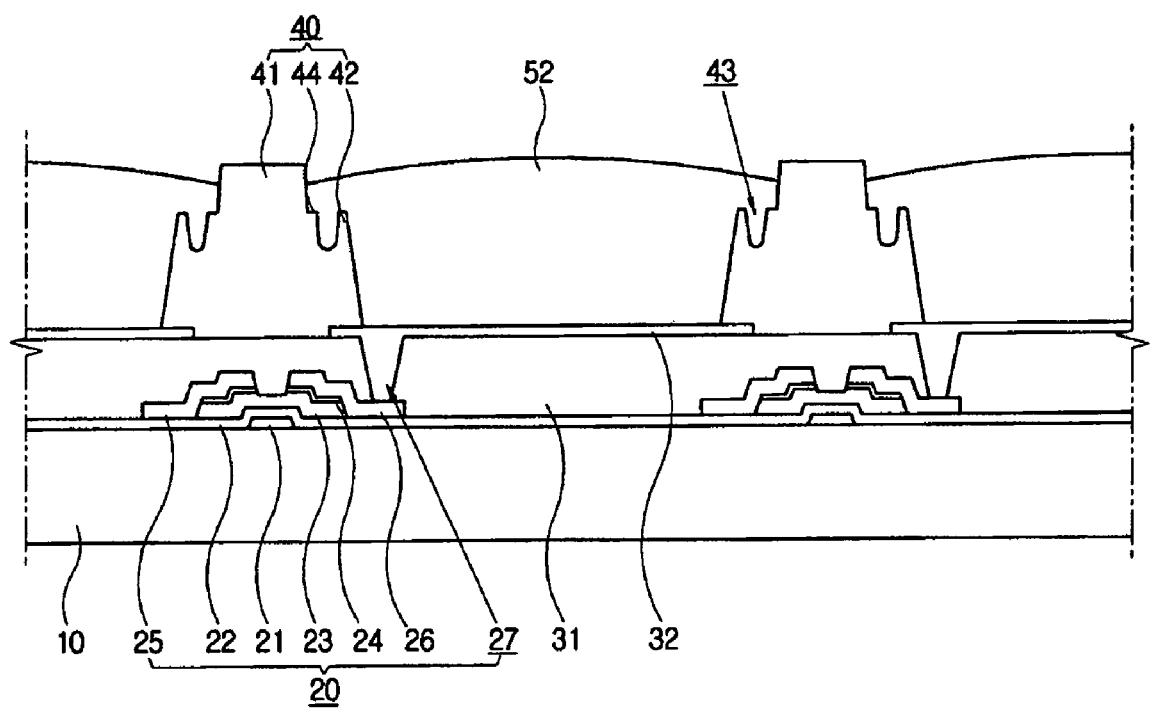

Referring to FIG. 3D, a hole-injecting solution 52, which is a polymer solution that contains a hole-injecting material, is dropped onto the pixel electrode 32 by an ink-jet method to form the hole-injecting layer 51. The hole-injecting solution 52 is disposed higher than the auxiliary walls 42 and fills the entire caved-in parts 43. Adjacent pools of hole-injecting solutions 52 are separated by the main wall 41 so that they do not mix with each other. The level of the hole-injecting solution 52 is not flat. Thus, its level is lower than the height of the main wall 41 close to the wall 40 but higher than the main wall 41 near the middle of a pool of the hole-injecting solution 52.

The hole-injecting solution 52 includes poly thiophene derivatives such as poly-3,4-ethylenedioxythiophene (PEDOT), a compound such as poly styrenesulfonate (PSS) and a polar solvent where the compound is dissolved. The polar solvent, for example, comprises isopropyl alcohol (IPA), n-butanol, γ-buthylolactone, N-methylpyrrolidone (NMP) and 1,3-dimethyl-2-imidazolidinon (DMI) and derivatives thereof and glycolether such as cabitol acetate, buthyl cabitol acetate or the like.

Figure 3E:
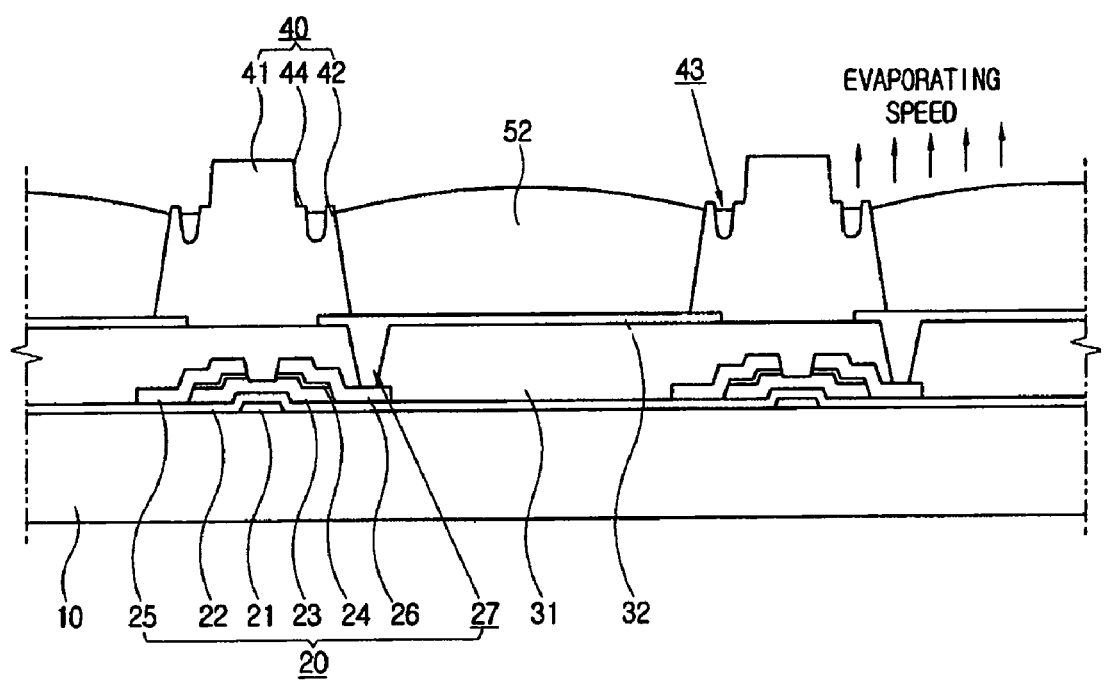

FIG. 3E shows a process for drying the hole-injecting solution 52 to remove the solvent. The drying process is performed under nitrogen at room temperature at a pressure of 1 Torr. If the pressure is too low, the hole-injecting solution 52 may rapidly evaporate. Also, if the temperature is higher than room temperature (e.g., standard temperature and pressure), the evaporation speed of the solvent increases so that it is hard to form a layer uniformly. The vapor density remains constant regardless of distance from the wall 40 due to the vapor of the solvent evaporating from the hole-injecting solution 52 in the caved-in parts 43 during the drying process. Accordingly, the solvent of the hole-injecting solution 52 is removed at regular rate regardless of its position in the pool of hole-injecting solution 52, and the hole-injecting material is prevented from migrating to certain parts of the pool.

Figure 3F:
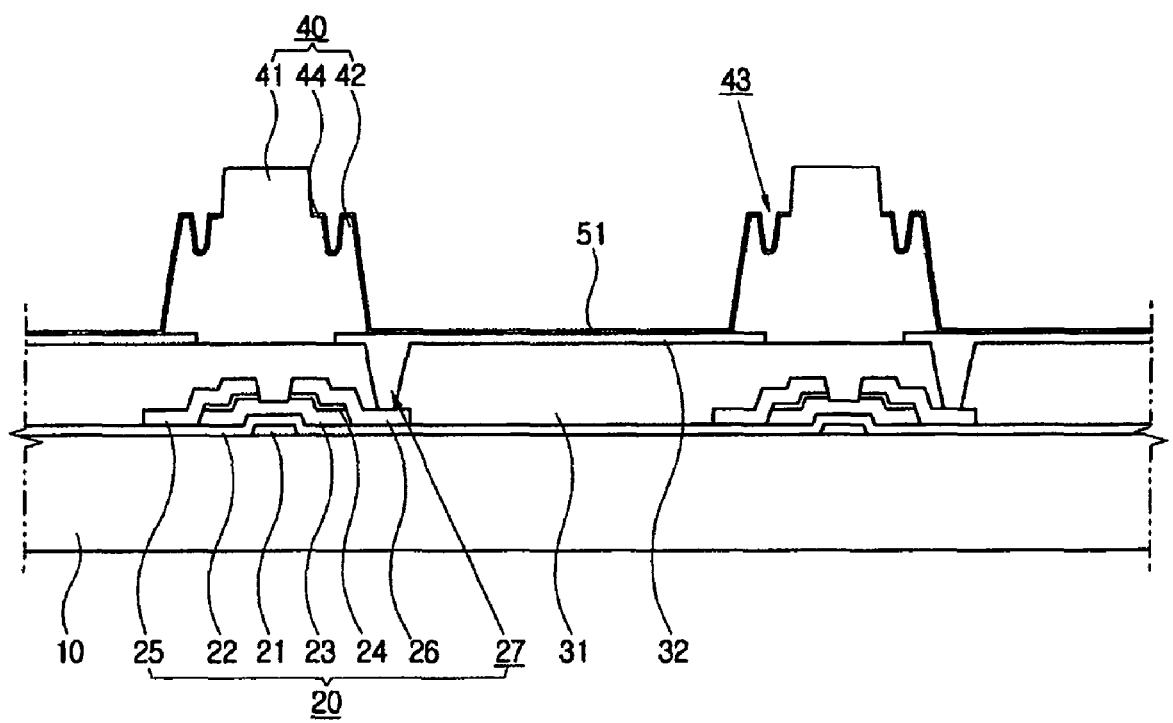

FIG. 3F shows that the hole-injecting layer 51 is formed after the hole-injecting solution 52 is completely dried. The hole-injecting layer 51 is formed on the pixel electrode 32 with a comparatively constant thickness. The constant thickness is achieved because, as mentioned above, the hole-injecting material does not migrate to certain positions during the drying process of the hole-injecting solution 52. The hole-injecting layer 51 is also formed on the caved-in parts 43, and the hole-injecting layer 51 on the caved-in parts 43 may be thinner than the corresponding layer on the pixel electrode 32.

After completing the drying process, heat treatment may be performed under nitrogen, but preferably in a vacuum. The heat treatment may be performed at a temperature of about 200° C. for 10 minutes, so that any solvent or water remaining in the hole-injecting layer 51 is removed.

Figure 3G:
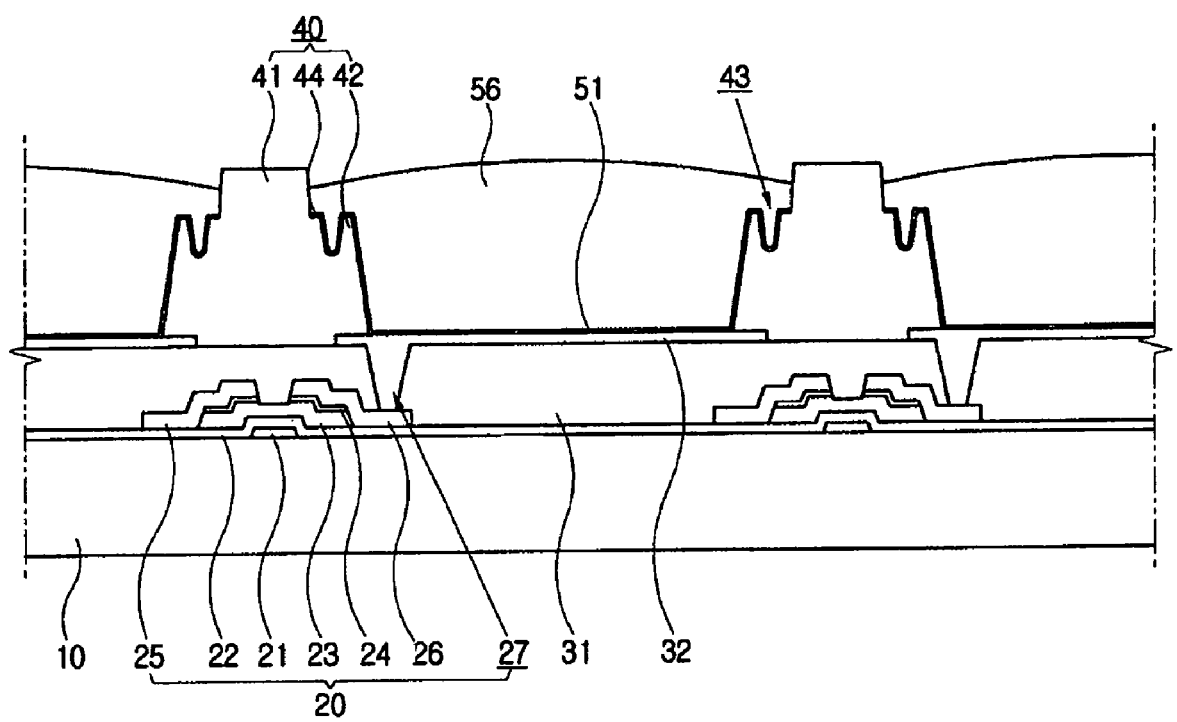

Referring to FIG. 3G, a light-emitting solution 56, which is a polymer solution containing a light-emitting material, is dropped on the pixel electrode 32 where the hole-injecting layer 51 is formed in order to form the light-emitting layer 55. The light-emitting solution 56 is disposed to a level higher than the auxiliary walls 42 and fills the entire caved-in parts 43. Adjacent light-emitting solutions 56 are separated by the main wall 41 so that they do not mix with each other. The light-emitting solution 56 is disposed lower than the main wall 41 close to the wall 40, but higher than the main wall 41 far from the wall 40.

The light-emitting solution 56 contains a nonpolar solvent that does not dissolve the hole-injecting layer 51, so that the hole-injecting layer 51 remains substantially intact even if it comes in contact with the light-emitting solution 56. The nonpolar solvent may be cyclohexylbenzene, Dehydrobenzofuran, trimethylbenzene, or tetramethylbenzene, among others.

The hole-injecting layer 51 does not have a chemical affinity to the nonpolar solvent. Thus, the light-emitting layer 55 may not adhere closely to the hole-injecting layer 51 or may not be applied uniformly in case of using the light-emitting solution 56 containing the nonpolar solvent.

To increase the chemical affinity of the hole-injecting layer 51 to the nonpolar solvent, a surface reforming process is performed on the hole-injecting layer 51 before dropping the light-emitting solution 56.

During the surface reforming process, a surface reforming agent is applied to the hole-injecting layer 51, and then dried and evaporated. The surface reforming agent may be cyclohexylbenzene, Dehydrobenzofuran, trimethylbenzene and tetramethylbenzene, which are the solvents of the light-emitting solution 56, or toluene and xylene which are similar to the solvent. The surface reforming agent may be applied by an ink-jet method, a spin coating method or a dip-coating method.

A surface of the hole-injecting layer 51 becomes chemically attractive to the nonpolar solvent through the surface reforming process, so that the light-emitting solution 56 may be uniformly applied.

Figure 3H:
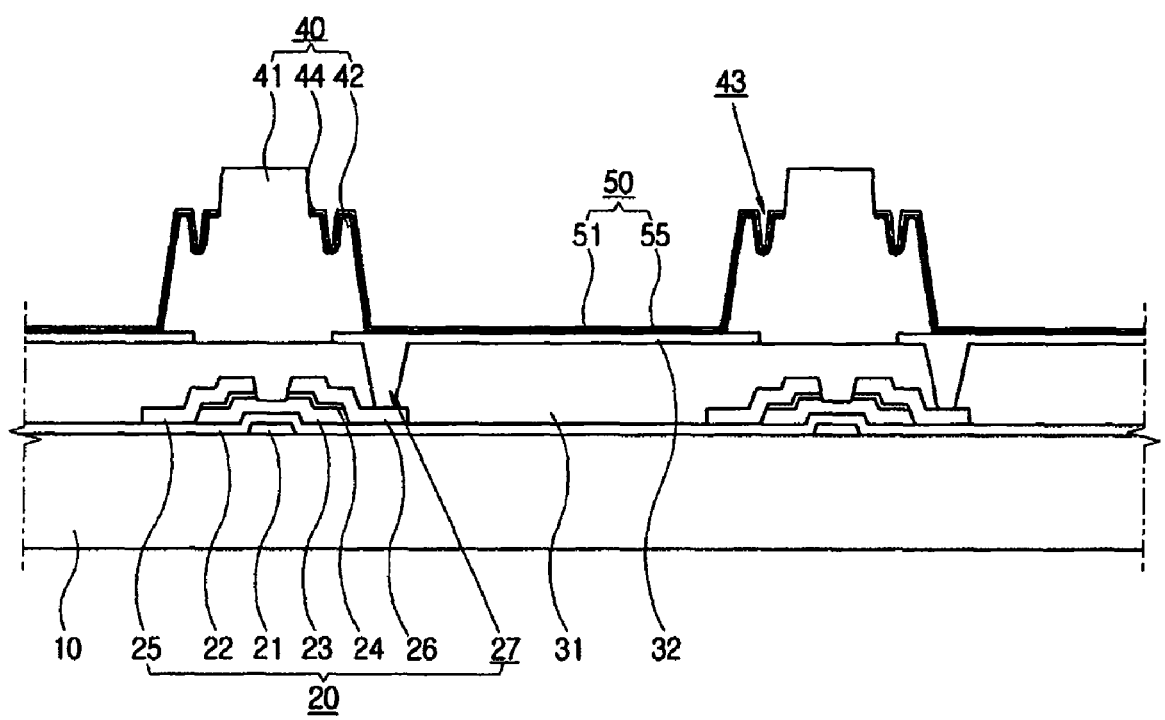

FIG. 3H shows that the light-emitting layer 55 is formed after the light-emitting solution 56 is completely dried. The drying process for the light-emitting solution 56 is substantially the same as of the drying process for the hole-injecting solution 52 described above. The light-emitting layer 55 is formed on the pixel electrode 32 with a comparatively constant thickness since the light-emitting material does not migrate in the drying process of the light-emitting solution 56. The light-emitting layer 55 is also formed on the caved-in parts 43 and may be thinner than one on the pixel electrode 32.

Thereafter, the common electrode 61 is formed on the light-emitting layer 55, and then the display device 1 as shown in FIG. 2 is completed.

Hereinafter, another method of making the display device according to the first embodiment of the present invention will be described with reference to FIG. 4. In this method, the wall 40 is formed by an imprint method.

Figure 4:
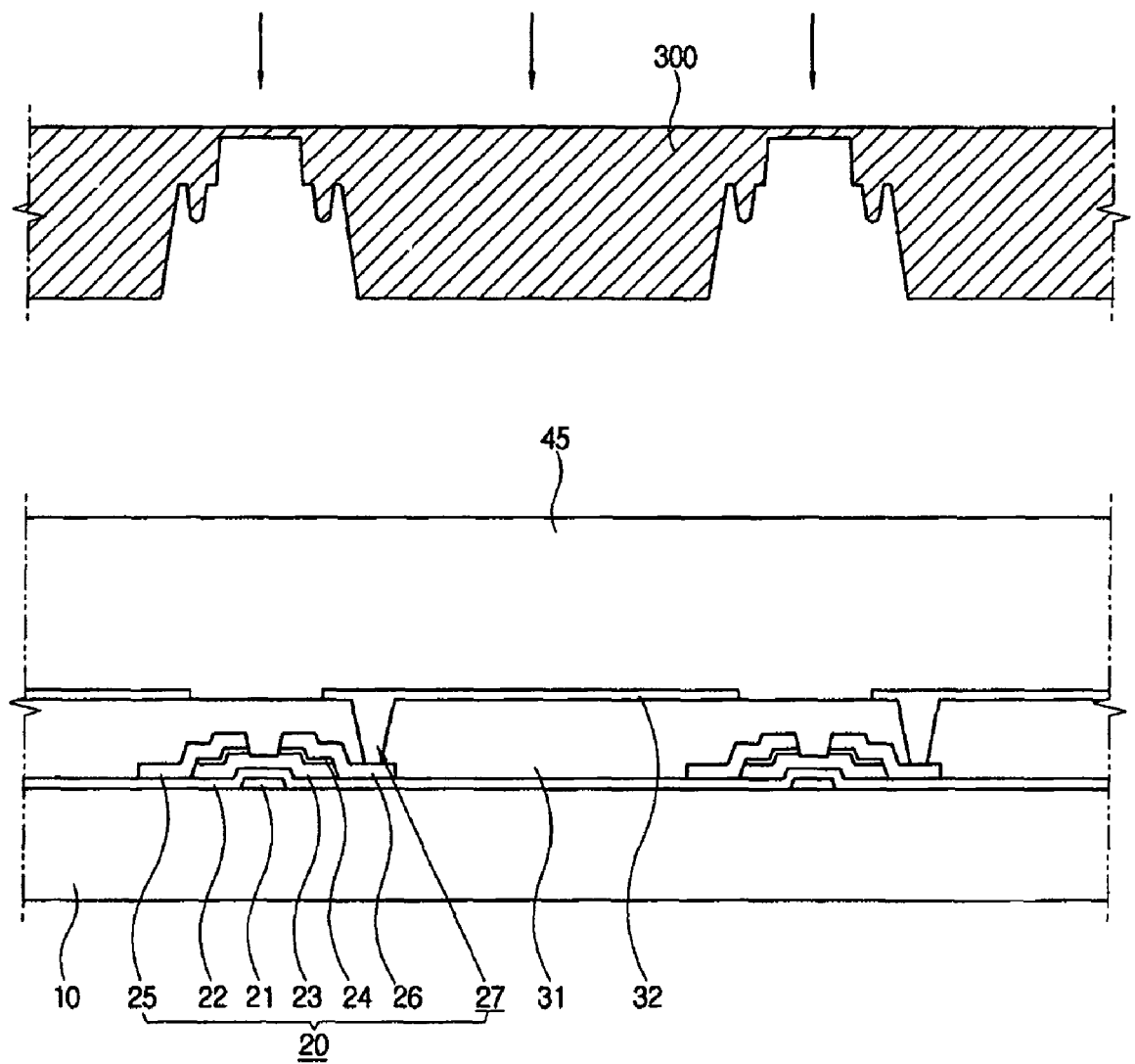
FIG. 4 is a sectional view to illustrate another method of making a display device according to the first embodiment of the present invention.

FIG. 4 shows that the wall material layer 45 is deposited on the pixel electrode 32. A wall forming mold 300 comprising a reverse pattern of the wall 40 is provided over the wall material layer 45. The wall forming mold 300 is pressed into the wall material layer 45 such that the wall material layer 45 fills the pattern of the wall forming mold 300 and the remainder is removed from the pixel electrode 32. The wall forming mold 300 may include a through hole (not shown) so that the extra wall material layer 45 can be removed. Then, the wall forming mold 300 is removed to leave the wall 40.

Figure 5:
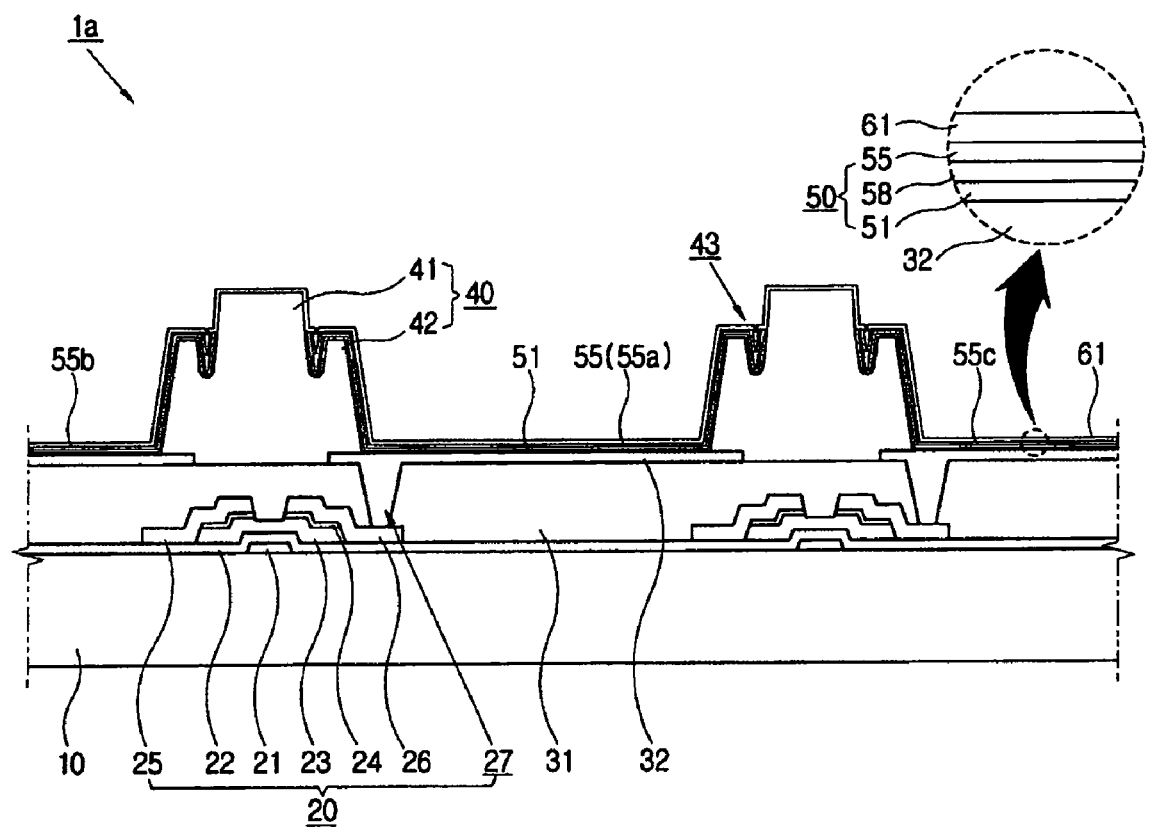
FIG. 5 is a sectional view of a display device according to a second embodiment of the present invention.

FIG. 5 is a sectional view of a display device according to a second embodiment of the present invention. A difference between the first embodiment and the second embodiment is as follows.

A wall 40 according to the second embodiment does not include a flat part 44 like the first embodiment. Thus, a main wall 41 is directly connected to the caved-in parts 43.

In the display device 1a according to the second embodiment, an intermediate layer 58 is formed between the hole-injecting layer 51 and the light-emitting layer 55. The intermediate layer 58 holds electrons from the light-emitting layer 55 so that they are not injected into the hole-injecting layer 51. Accordingly, the hole-injecting layer 51, especially the hole-injecting layer made of PEDOT, is properly protected to increase the lifespan of the display device. The intermediate layer 58 is formed by an ink-jet method the same way as the hole-injecting layer 51 and the light-emitting layer.

As described above, the present invention provides a display device having a substantially flat organic layer.

Also, the present invention provides a method of making a display device with a substantially flat organic layer.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
a plurality of thin film transistors;
a passivation layer formed on the thin film transistors;
a plurality of pixel electrodes formed on the passivation layer and electrically connected to the thin film transistors;
a wall dividing the pixel electrodes, the wall having a main wall and an auxiliary wall that is lower than the main wall; and
an organic layer formed on the pixel electrodes.

2. The display device according to claim 1, wherein the organic layer formed on the auxiliary wall is thinner than the organic layer on the pixel electrode.

3. The display device according to claim 2, wherein the height of the auxiliary wall is about 50% to about 90% of the height of the main wall.

4. The display device according to claim 3, wherein the height of the auxiliary wall is in the range of about 0.25 μm to about 4.5 μm.

5. The display device according to claim 4, wherein the organic layer comprises a hole-injecting layer and a light-emitting layer.

6. The display device according to claim 5, wherein the hole-injecting layer comprises a material selected from the group consisting of poly-3,4-ethylenedioxythiophene and poly styrenesulfonate.

7. The display device according to claim 5, wherein the light-emitting layer comprises a material selected from the group consisting of polyfluorene derivatives, poly(p-phenylene vinylene) derivatives, polyphenylene derivatives, poly(N-vinylcarbazole) derivatives, poly thiophene derivatives and compounds thereof doped with a perillene group pigment, rhodamine, rubrene, perillene, 9,10-diphenylanthracene, tetraphenylbutadiene, nile red, cumarine 6, quinacridone.

8. The display device according to claim 2, wherein the organic layer comprises a light-emitting layer and a hole-injecting layer comprising a material selected from the group consisting of poly-3,4-ethylenedioxythiophene and poly styrenesulfonate.

9. The display device according to claim 2, wherein the organic layer comprises a hole-injecting layer and a light-emitting layer comprising a material selected from the group consisting of polyfluorene derivatives, poly(p-phenylene vinylene) derivatives, polyphenylene derivatives, poly(N-vinylcarbazole) derivatives, poly thiophene derivatives and compounds thereof doped with a perillene group pigment, rhodamine, rubrene, perillene, 9,10-diphenylanthracene, tetraphenylbutadiene, nile red, cumarine 6, quinacridone.

10. The display device according to 1, wherein the height of the auxiliary wall is about 50% to about 90% of the height of the main wall.

11. The display device according to claim 10, wherein the height of the auxiliary wall is in the range of about 0.25 μm to about 4.5 μm.

12. The display device according to claim 11, wherein the organic layer comprises a light-emitting layer and a hole-injecting layer comprising a material selected from the group consisting of poly-3,4-ethylenedioxythiophene and poly styrenesulfonate.

13. The display device according to claim 11, wherein the organic layer comprises a hole-injecting layer and a light-emitting layer comprising a material selected from the group consisting of polyfluorene derivatives, poly(p-phenylene vinylene) derivatives, polyphenylene derivatives, poly(N-vinylcarbazole) derivatives, poly thiophene derivatives and compounds thereof doped with a perillene group pigment, rhodamine, rubrene, perillene, 9,10-diphenylanthracene, tetraphenylbutadiene, nile red, cumarine 6, quinacridone.

14. The display device according to claim 1, wherein the organic layer comprises a light-emitting layer and a hole-injecting layer comprising a material selected from the group consisting of poly-3,4-ethylenedioxythiophene and poly styrenesulfonate.

15. The display device according to claim 1, wherein the organic layer comprises a hole-injecting layer and a light-emitting layer comprising a material selected from the group consisting of polyfluorene derivatives, poly(p-phenylene vinylene) derivatives, polyphenylene derivatives, poly(N-vinylcarbazole) derivatives, poly thiophene derivatives and compounds thereof doped with a perillene group pigment, rhodamine, rubrene, perillene, 9,10-diphenylanthracene, tetraphenylbutadiene, nile red, cumarine 6, quinacridone.

* * * * *